United States Patent
Moeneclaey et al.

(10) Patent No.: US 11,713,998 B2
(45) Date of Patent: Aug. 1, 2023

(54) AMBIENT LIGHT SENSOR AND METHOD

(71) Applicants: STMicroelectronics (Grenoble 2) SAS, Grenoble (FR); STMicroelectronics International N.V., Geneva (CH)

(72) Inventors: Nicolas Moeneclaey, Vourey (FR); Sri Ram Gupta, Noida (IN); Sarika Kushwaha, Noida (IN)

(73) Assignees: STMICROELECTRONICS INTERNATIONAL N.V., Geneva (CH); STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 17/663,915

(22) Filed: May 18, 2022

(65) Prior Publication Data

US 2022/0373388 A1     Nov. 24, 2022

(30) Foreign Application Priority Data

May 19, 2021   (FR) ........................................ 2105221

(51) Int. Cl.
*G01J 1/42* (2006.01)
*G01J 1/44* (2006.01)

(52) U.S. Cl.
CPC .............. *G01J 1/4204* (2013.01); *G01J 1/44* (2013.01); *G01J 2001/446* (2013.01)

(58) Field of Classification Search
CPC .... G01J 1/4204; G01J 1/42; G01J 1/44; G01J 2001/446; H03F 3/08; H03F 3/04;
(Continued)

(56) References Cited

U.S. PATENT DOCUMENTS 4,884,039 A * 11/1989 King .................. H03F 3/45753
                                                       330/253
6,049,246 A *  4/2000 Kozisek ............. H03F 3/45179
                                                       330/253
(Continued)

FOREIGN PATENT DOCUMENTS

EP           2015439 A2    1/2009
WO       2004043062 A1    5/2004

OTHER PUBLICATIONS

Schonle, Philipp et al., "A Power-Efficient Multi-Channel PPG ASIC with 112dB Receiver DR for Pulse Oximetry and NIRS", IEEE Custom Integrated Circuits Conference (CICC), DOI: 10.1109/CICC.2017.7993704, Apr. 30-May 3, 2017, Austin, TX, 4 pages.

*Primary Examiner* — John R Lee
(74) *Attorney, Agent, or Firm* — Slater Matsil, LLP

(57) ABSTRACT

According to one aspect, an ambient-light sensor includes a photodiode configured to generate an electrical signal according to an ambient light, a capacitive-feedback transimpedance amplifier connected at its input to the photodiode for receiving a signal generated by the photodiode and for generating as an output an amplified signal from the signal generated by the photodiode, and an auto-zero switch at the input of the capacitive-feedback transimpedance amplifier. The ambient-light sensor further includes a control circuit including a bootstrap circuit configured to receive an initial positive- or zero-voltage logic control signal, and then generate, from this initial logic control signal, an adapted logic control signal having a first positive voltage level and a second negative voltage control level for controlling the auto-zero switch.

20 Claims, 3 Drawing Sheets

(58) Field of Classification Search
CPC ........ H03F 3/087; H03F 3/45; H03F 3/45973; H03F 3/45977; H03F 3/45928; H03F 3/45932; H03F 3/45946; H03F 2200/369
See application file for complete search history.

(56) References Cited

U.S. PATENT DOCUMENTS

| | | | | |
|---|---|---|---|---|
| 6,392,475 | B1* | 5/2002 | Lee | H03F 3/45475 |
| | | | | 330/69 |
| 6,803,555 | B1* | 10/2004 | Parrish | G01J 1/46 |
| | | | | 250/214 AG |
| 7,148,727 | B2* | 12/2006 | Van Bogget | H03F 3/45977 |
| | | | | 327/87 |
| 7,525,472 | B2* | 4/2009 | Kawae | H03M 1/52 |
| | | | | 327/540 |
| 7,642,846 | B2* | 1/2010 | Yan | H04N 25/75 |
| | | | | 330/253 |
| 9,245,650 | B2* | 1/2016 | Inoue | G11C 27/026 |
| 9,300,259 | B2* | 3/2016 | Fröhlich | H03F 1/34 |
| 9,614,623 | B2* | 4/2017 | Gottfried | H03F 3/45475 |
| 11,067,439 | B2* | 7/2021 | Lee | H03F 3/45071 |
| 11,108,404 | B1* | 8/2021 | Li | H03M 1/0863 |
| 11,112,303 | B2* | 9/2021 | Joos | G01J 1/44 |
| 11,320,468 | B2* | 5/2022 | Hsu | G01N 33/483 |
| 2009/0009642 | A1 | 1/2009 | Joshi et al. | |
| 2009/0033377 | A1* | 2/2009 | Hashimoto | H02M 1/08 |
| | | | | 327/112 |
| 2013/0193948 | A1 | 8/2013 | Lee et al. | |
| 2015/0326805 | A1* | 11/2015 | Scott | H01L 27/14689 |
| | | | | 348/243 |
| 2020/0386617 | A1 | 12/2020 | Williams, III et al. | |
| 2022/0373388 | A1* | 11/2022 | Moeneclaey | G01J 1/46 |

\* cited by examiner

AMBIENT LIGHT SENSOR AND METHOD

CROSS-REFERENCE TO RELATED APPLICATIONS

This application claims the benefit of French Patent Application No. 2105221, filed on May 19, 2021, which application is hereby incorporated herein by reference.

TECHNICAL FIELD

Embodiments relate to ambient-light sensors and methods.

BACKGROUND

An ambient-light sensor is a photodetector configured to detect a quantity of ambient light around this sensor.

Such an ambient-light sensor may be integrated in smartphones or in portable computers for example. In particular, the ambient-light sensor may be used for adapting a brightness of the screen of a smartphone or of a portable computer according to the ambient light.

An ambient-light sensor generally comprises a photodiode configured to generate an electrical signal dependent on the ambient light around this photodiode.

This electrical signal is next amplified by an amplifier of the ambient-light sensor before being processed.

To amplify the electrical signal generated by the photodiode, it is possible to use a capacitive-feedback transimpedance amplifier (also known by the acronym CTIA—"capacitive transimpedance amplifier").

Such an amplifier comprises an operational amplifier looped by a capacitive element.

In particular, the operational amplifier may have a first inverting input connected to the photodiode, and a non-inverting input connected to a cold point, in particular an earth. The operational amplifier also comprises an output configured to deliver an amplified signal from the electrical signal delivered by the photodiode.

The output of the operational amplifier is connected to a first terminal of the capacitive element, and a second terminal of the capacitive element is connected to the inverting input of the operational amplifier.

Moreover, it is preferable to use an auto-zero switch or "AZ switch" between the inverting input and the non-inverting input of the operational amplifier.

In particular, the auto-zero switch makes it possible to eliminate a voltage offset at the input of the amplifier ("input offset voltage").

The auto-zero switch may be an NMOS transistor.

Moreover, it is important to reduce the losses of information by the capacitive element during the integration time of the transimpedance amplifier.

This is because, as the electrical signals that may be generated by the photodiode have low intensity, of the order of a picoampere or nanoampere, the losses may cause significant errors in the measurement of the ambient light.

It is in particular possible to use a low-loss auto-zero switch having a high threshold voltage. Nevertheless, manufacturing such a low-loss auto-zero switch requires the use of an additional mask. Thus, such a solution is complex and expensive to implement.

There is therefore a need to propose a simple and inexpensive solution for reducing the losses of the switch between the inputs of the capacitive-feedback transimpedance amplifier.

SUMMARY

According to one aspect, an ambient-light sensor comprises a photodiode configured to generate an electrical signal according to an ambient light, a capacitive-feedback transimpedance amplifier connected at its input to the photodiode for receiving a signal generated by the photodiode and for generating as an output an amplified signal from the signal generated by the photodiode, an auto-zero switch at the input of the capacitive-feedback transimpedance amplifier, and a control circuit comprising a bootstrap circuit configured to receive an initial positive- or zero-voltage logic control signal, then generate, from this initial logic control signal, an adapted logic control signal having a first positive voltage level and a second negative voltage control level for controlling the auto-zero switch.

Being able to control the auto-zero switch with a negative voltage during the integration time makes it possible to reduce the losses.

Such an ambient-light sensor therefore makes it possible to reduce the errors in measuring the ambient light.

Furthermore, such an ambient-light sensor does not require using an auto-zero transistor having a high threshold voltage. This makes it possible to avoid the use of an additional mask for manufacturing the auto-zero transistor.

The bootstrap circuit therefore makes it possible to use an auto-zero transistor that is inexpensive to manufacture.

In an advantageous embodiment, the bootstrap circuit comprises an inverter gate configured to receive the initial logic control signal, a capacitive element having a first terminal connected to an output of the inverter gate, a first transistor of the PFET type having a gate configured for receiving the initial logic control signal, a drain connected to the second terminal of the capacitive element and a source configured for receiving a common-mode voltage, an output connected to the second terminal of the capacitive element and to the drain of the first transistor and configured for delivering the adapted logic control signal to the auto-zero switch.

Preferably, the initial logic control signal has a first level at 1.8V and a second level at 0V, and the adapted logic control signal has a first positive level at 0.9V when the initial logic control signal is at 0V, and a second negative level at −0.9V when the initial logic control signal is at 1.8V.

Advantageously, the bootstrap circuit further comprises a second transistor of the NFET type having a source connected to the second terminal of the capacitive element, a gate configured for receiving the initial logic control signal and a drain connected to the output of the bootstrap circuit, a transistor of the PFET type having a source connected to the output of the inverter gate, a gate configured for receiving the initial logic control signal and a drain connected to the output of the bootstrap circuit.

Thus, the second terminal of the capacitive element is connected to the output by means of the second transistor.

Preferably, the initial logic control signal has a first level at 1.8V and a second level at 0V, and the adapted logic control signal has a first positive level at 1.8V when the initial logic control signal is at 0V, and a second negative level at −0.9V when the initial logical control signal is at 1.8V.

In an advantageous embodiment, the capacitive-feedback transimpedance amplifier comprises an operational amplifier including an inverting input connected to the photodiode and a non-inverting input connected to a cold point, the auto-zero switch having a first terminal connected to the inverting input of this operational amplifier and a second terminal connected to the non-inverting input of this operational amplifier.

Preferably, the capacitive-feedback transimpedance amplifier comprises a capacitive element having a first terminal connected to an output of the operational amplifier and a second terminal connected to the inverting input of the operational amplifier.

According to another aspect, an apparatus is proposed including an ambient-light sensor as described above.

BRIEF DESCRIPTION OF THE DRAWINGS

Other advantages and features of the invention will emerge from an examination of the detailed description of in no way limitative embodiments and implementations, and the accompanying drawings, on which.

DETAILED DESCRIPTION OF ILLUSTRATIVE EMBODIMENTS

Figure 1:
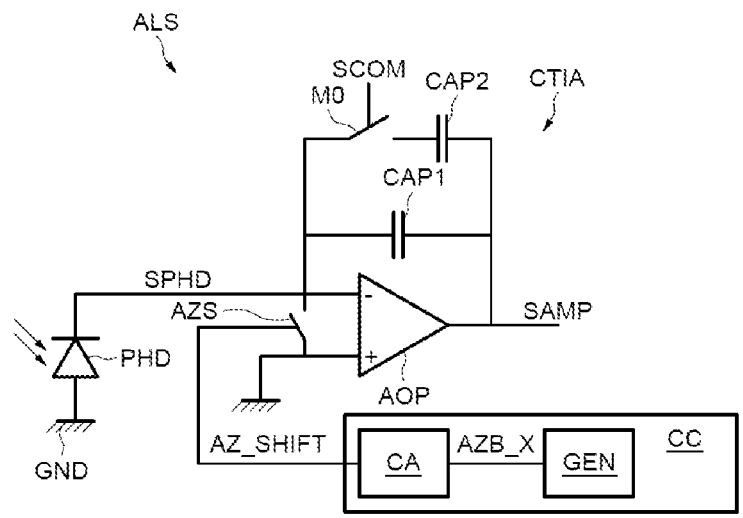
FIG. 1 illustrates a block diagram of an ambient light sensor.

As shown in FIG. 1, the ambient-light sensor ALS comprises a photodiode PHD.

The photodiode PHD is configured for generating an electrical signal SPHD according to the ambient light around the sensor ALS.

The ambient-light sensor ALS comprises a capacitive transimpedance amplifier CTIA.

The capacitive-feedback transimpedance amplifier CTIA comprises an operational amplifier AOP.

The operational amplifier AOP has an inverting input connected to the photodiode PHD. In this way, the inverting input of the operational amplifier AOP is configured for receiving the electrical signal SPHD generated by the photodiode PHD.

The operational amplifier AOP also has a non-inverting input connected to a cold point, in particular an earth GND.

The operational amplifier AOP has an output configured for delivering an amplified signal SAMP from the signal SPHD generated by the photodiode.

The amplifier CTIA comprises a first capacitive element CAP1 looping the operational amplifier AOP. In particular, the second capacitive element CAP1 has a first terminal connected to the output of the operational amplifier AOP, and a second terminal connected to the inverting input of the operational amplifier.

The amplifier CTIA also comprises a second capacitive element CAP2 looping the operational amplifier AOP. In particular, the second capacitive element CAP2 has a first terminal connected to the output of the operational amplifier AOP and a second terminal connected to the inverting input of the operational amplifier.

More particularly, the second terminal of the second capacitive element CAP2 is connected to the inverting input of the amplifier by means of at least one switch M0. Each switch M0 can be implemented by an NMOS transistor.

The second capacitive element CAP2 has a capacitance equal to the capacitance of the first capacitive element CAP1.

The switch M0 is configured for being controlled by a control signal SCOM having a low level at −0.9V and a high level at 1.8V.

Thus, the second capacitive element CAP1 makes it possible to divide by two the gain of the amplifier CTIA when the switch M0 is closed.

The ambient-light sensor also comprises an auto-zero switch AZS. This auto-zero switch AZS has a first terminal connected to the inverting input of the operational amplifier AOP and a second terminal connected to the non-inverting input of the operational amplifier AOP. This auto-zero switch AZS may for example be implemented by an NMOS transistor.

The auto-zero switch AZS makes it possible to eliminate a voltage offset at the input of the operational amplifier AOP ("input offset voltage").

The ambient-light sensor ALS comprises a control circuit CC for controlling the auto-zero AZS.

The control circuit CC comprises an initial control signal generator GEN. This generator GEN is configured for generating an initial inverted control logical signal AZB_X.

The initial inverted control signal AZB_X may for example vary between 0V and 1.8V.

In order to adapt the initial control signal AZB_X to reduce the losses of the auto-zero switch AZS, the control circuit CC comprises a bootstrap circuit CA.

The bootstrap circuit CA is thus configured for controlling the auto-zero switch AZS with an adapted logic control signal AZ_SHIFT.

Figure 2:
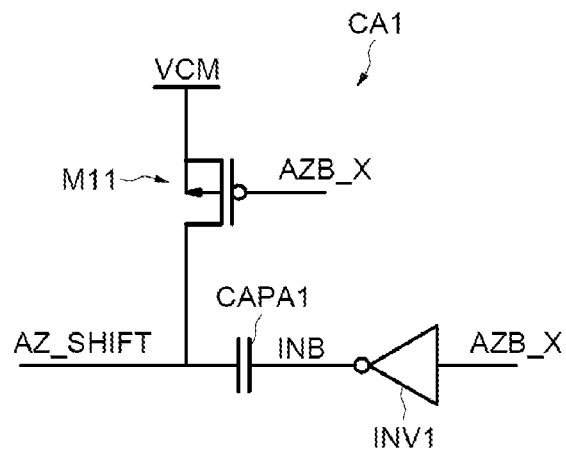
FIG. 2 illustrates a schematic of a first embodiment of a bootstrap circuit.

FIG. 2 shows a first embodiment of such a bootstrap circuit CA1.

The bootstrap circuit CA1 comprises an inverter gate INV1, a capacitive element CAPA1 and a transistor M11.

Figure 3:
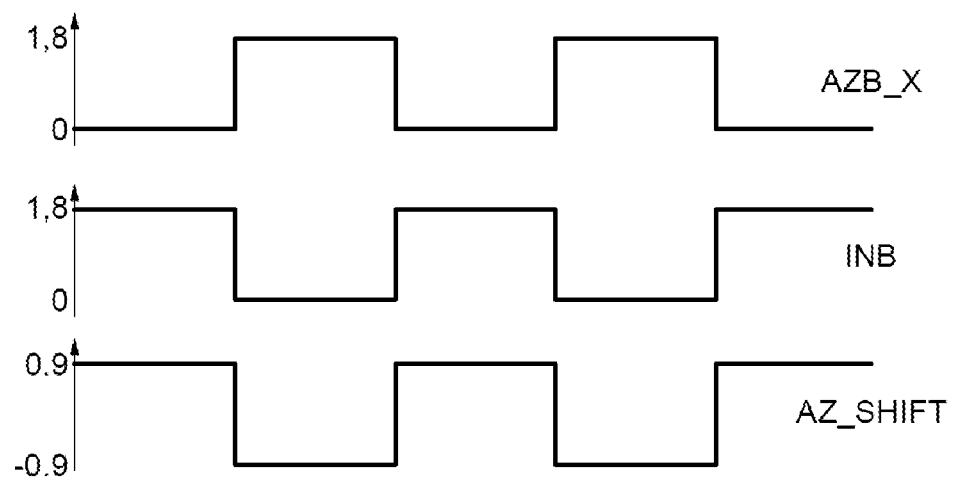
FIG. 3 illustrates a timing diagram for the bootstrap circuit of FIG. 2.

The bootstrap circuit CA1 is configured to receive as an input the initial inverted control signal AZB_X. As shown in FIG. 3, the initial inverted control signal AZB_X may for example vary between 0V and 1.8V.

The inverter gate INV1 has an input configured to receive the initial inverted control signal AZB_X.

The inverter gate INV1 makes it possible to invert the initial signal AZB_X. Thus, the inverter gate INV1 makes it possible to obtain a signal INB having a voltage at 1.8V when the signal AZB_X is at 0V, and a voltage at 0V when the signal AZB_X is at 1.8V.

The capacitive element CAPA1 has a first terminal connected to the output of the inverter gate INV1 and a second terminal connected to a drain of the transistor M11.

The capacitive element CAPA1 has for example a capacitance of between 100 fF and 1 pF.

The capacitive element CAPA1 makes it possible to obtain a negative voltage at the second terminal thereof. In particular, this voltage is equal −0.9V.

The transistor M11 is a transistor of the PFET type (P-channel MOSFET transistor).

The transistor M11 has a drain connected to the second terminal of the capacitive element CAPA1, a gate configured to receive the initial inverted control signal AZB_X and a source configured to receive a common-mode voltage VCM.

For example, the common-mode voltage VCM is equal to 0.9V.

The transistor M11 is on when the signal AZB_X is at 0V. Thus, the transistor M11 makes it possible to obtain a signal AZ_SHIFT at the output of the bootstrap circuit CA1 having a voltage equal to the voltage VCM, i.e. 0.9V, when the signal AZB_X is at 0V.

Thus, the voltage of the signal AZ_SHIFT at the output of the bootstrap circuit CA1 is between −0.9V and 0.9V. In particular, the output voltage is at 0.9V when the voltage of the signal AZB_X is at 0V, and is at −0.9V when the voltage of the signal AZB_X is at 1.8V.

The negative voltage of the signal AZ_SHIFT makes it possible to obtain a negative gate-source voltage on the auto-zero switch AZS. This makes it possible to reduce the losses of the auto-zero switch, in particular during the integration period.

Figure 4:
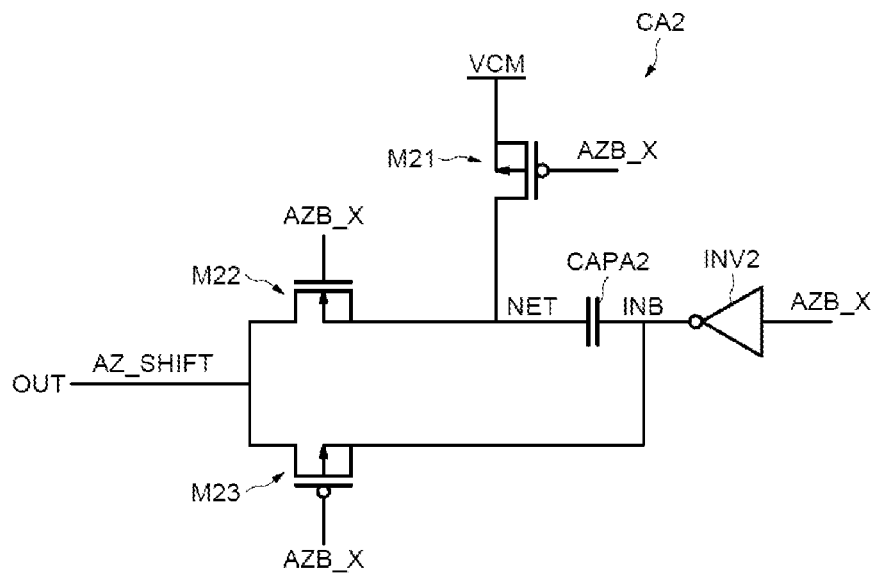
FIG. 4 illustrates a schematic of a second embodiment of a bootstrap circuit.

FIG. 4 shows a second embodiment of the bootstrap circuit CA2.

The bootstrap circuit CA2 comprises an inverter gate INV2, a capacitive element CAPA2, a first transistor M21, a second transistor M22 and a third transistor M23.

The bootstrap circuit CA2 is configured to receive as an input the initial inverted control signal AZB_X.

The inverter gate INV2 has an input configured to receive the signal AZB_X and an output configured to deliver a signal INB inverted with respect to the signal AZB_X. Thus, as shown in FIG. 4, the signal INB can be at 1.8V when the signal AZB_X is at 0V, and at 0V when the signal AZB_X is at 1.8V.

The capacitive element CAPA2 comprises a first terminal connected to the output of the inverter gate INV2, and a second terminal connected to a drain of the first transistor M21 and to a source of the second transistor M22.

The capacitive element CAPA2 makes it possible to obtain a voltage at −0.9V at the second terminal of the capacitive element CAPA2 when the voltage of the signal IN is at 1.8V.

The first transistor M21 is a transistor of the PFET type.

The first transistor M21 has a drain connected to the second terminal of the capacitive element, a gate configured to receive the signal AZB_X and a source configured to receive the common-mode voltage VCM.

For example, the common-mode voltage VCM is equal to 0.9V.

The transistor M21 is on when the signal AZB_X is at 0V. Thus, the transistor M21 makes it possible to obtain a voltage at the drain of this transistor M21 equal to the voltage VCM, i.e. 0.9V, when the signal AZB_X is at 0V.

Thus, the signal NET at the drain of the transistor M21 has a voltage between −0.9V and 0.9V. In particular, this voltage is at 0.9V when the voltage of the signal AZB_X is at 0, and is at −0.9V when the voltage of the signal AZB_X is at 1.8V.

The second transistor M22 is a transistor of the NFET type (N-channel MOSFET transistor).

The second transistor M22 has a source connected to the drain of the first transistor M21 and to the second terminal of the capacitive element CAPA2.

The second transistor M22 also has a gate configured to receive the signal AZB_X, and a drain connected to an output OUT configured to deliver an adapted control signal AZ_SHIFT.

Figure 5:
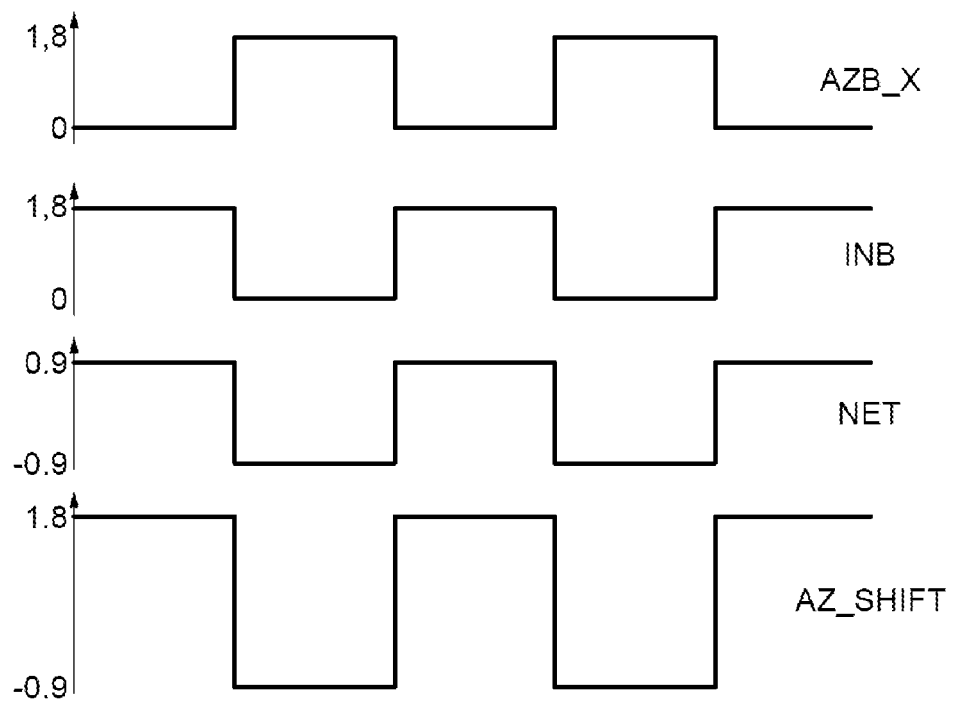
FIG. 5 illustrates a timing diagram for the bootstrap circuit of FIG. 4.

With reference to FIG. 5, the second transistor M22 is on when the signal AZB_X is at 1.8V. Thus, the transistor M21 makes it possible to obtain a voltage of the adapted control signal AZ_SHIFT at the output of the bootstrap circuit CA2 equal to −0.9V when the AZB_X is at 1.8V.

The transistor M23 is a transistor of the PFET type.

The third transistor M23 has a source connected to the output of the inverter gate, a gate configured to receive the signal IN, and a drain connected to the output OUT.

The third transistor M23 is on when the signal AZB_X is at 0V. Thus, the transistor M21 makes it possible to obtain a voltage of the adapted control AZ_SHIFT at the output of the bootstrap circuit CA2 equal to 1.8V when the signal AZB_X is at 0V.

Thus, the voltage of the adapted control signal AZ_SHIFT at the output of the bootstrap circuit is between −0.9V and 1.8V. In particular, the voltage of the adapted control signal AZ_SHIFT at the output of the bootstrap circuit is at 1.8V when the voltage of signal AZB_X is at 0V, and is at −0.9V when the voltage of the signal AZB_X is at 1.8V.

Such a voltage makes it possible to obtain a negative gate-source voltage on the auto-zero switch AZS. This makes it possible to reduce the losses of the auto-zero switch, in particular during the integration period.

Furthermore, applying a voltage at 1.8V for controlling the auto-zero switch AZS affords better operation of this auto-zero switch AZS.

Figure 6:
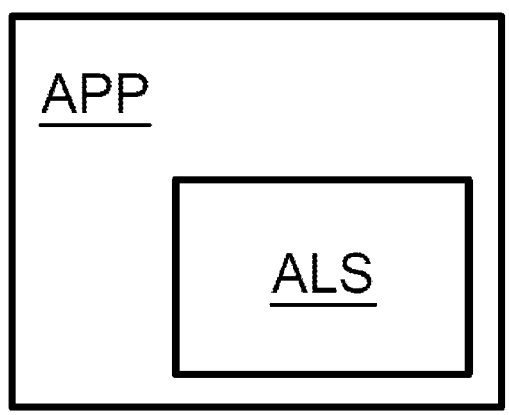
FIG. 6 illustrates a block diagram of an apparatus including an ambient-light sensor.

FIG. 6 illustrates an apparatus APP including an ambient-light sensor ALS as described previously. For example, the apparatus may be a smartphone or a portable computer.

What is claimed is:

1. An ambient-light sensor comprising:
   a photodiode configured to generate an electrical signal according to an ambient light;
   a capacitive-feedback transimpedance amplifier having an input connected to the photodiode for receiving the electrical signal generated by the photodiode, and having an output for generating an amplified signal from the electrical signal generated by the photodiode;
   an auto-zero switch connected to the input of the capacitive-feedback transimpedance amplifier; and
   a control circuit comprising a bootstrap circuit configured to:
      receive an initial logic control signal, wherein the initial logic control signal is a positive- or zero-voltage logic control signal; and
      generate, from the initial logic control signal, an adapted logic control signal having a first positive voltage level and a second negative voltage control level for controlling the auto-zero switch.

2. The sensor according to claim 1, wherein the bootstrap circuit comprises:
   an inverter gate having an input configured to receive the initial logic control signal;
   a capacitive element having a first terminal connected to an output of the inverter gate;
   a P-channel metal-oxide-semiconductor field effect transistor (PFET) having a gate configured to receive the initial logic control signal, a drain connected to a second terminal of the capacitive element, and a source configured to receive a common-mode voltage; and
   an output connected to the second terminal of the capacitive element and to the drain of the PFET, and configured to provide the adapted logic control signal to control the auto-zero switch.

3. The sensor according to claim 2, wherein the initial logic control signal has a first level of 1.8V and a second level of 0V, and the adapted logic control signal has a first positive level of 0.9V when the initial logic control signal is at 0V, and a second negative level at −0.9V when the initial logic control signal is at 1.8V.

4. The sensor according to claim 2, wherein the bootstrap circuit further comprises:
   an N-channel metal-oxide-semiconductor field effect transistor (NFET) having a source connected to the second terminal of the capacitive element, a gate configured to receive the initial logic control signal, and a drain connected to the output of the bootstrap circuit; and a second PFET having a source connected to the output of the inverter gate, a gate configured to receive the initial logic control signal and a drain connected to the output of the bootstrap circuit.

5. The sensor according to claim 4, wherein the initial logic control signal has a first level of 1.8V and a second level of 0V, and the adapted logic control signal has a first positive level of 1.8V when the initial logic control signal is at 0V, and a second negative level of −0.9V when the initial logic control signal is at 1.8V.

6. The sensor according to claim 1, wherein the capacitive-feedback transimpedance amplifier comprises an operational amplifier including an inverting input connected to the photodiode and a non-inverting input connected to a cold point, and wherein the auto-zero switch has a first terminal connected to the inverting input of the operational amplifier, and a second terminal connected to the non-inverting input of the operational amplifier.

7. The sensor according to claim 6, wherein the capacitive-feedback transimpedance amplifier comprises a capacitive element having a first terminal connected to an output of the operational amplifier and a second terminal connected to the inverting input of the operational amplifier.

8. An apparatus comprising:
an ambient-light sensor comprising:
a photodiode configured to generate an electrical signal according to an ambient light;
a capacitive-feedback transimpedance amplifier having an input connected to the photodiode for receiving the electrical signal generated by the photodiode, and having an output for generating an amplified signal from the electrical signal generated by the photodiode;
an auto-zero switch connected to the input of the capacitive-feedback transimpedance amplifier; and
a control circuit comprising a bootstrap circuit configured to:
receive an initial logic control signal, wherein the initial logic control signal is a positive- or zero-voltage logic control signal; and
generate, from the initial logic control signal, an adapted logic control signal having a first positive voltage level and a second negative voltage control level for controlling the auto-zero switch; and
a screen configured to adapt a brightness of the screen to the ambient light in accordance with the amplified signal.

9. The apparatus according to claim 8, wherein the bootstrap circuit comprises:
an inverter gate having an input configured to receive the initial logic control signal;
a capacitive element having a first terminal connected to an output of the inverter gate;
a P-channel metal-oxide-semiconductor field effect transistor (PFET) having a gate configured to receive the initial logic control signal, a drain connected to a second terminal of the capacitive element, and a source configured to receive a common-mode voltage; and
an output connected to the second terminal of the capacitive element and to the drain of the PFET, and configured to provide the adapted logic control signal to control the auto-zero switch.

10. The apparatus according to claim 9, wherein the initial logic control signal has a first level of 1.8V and a second level of 0V, and the adapted logic control signal has a first positive level of 0.9V when the initial logic control signal is at 0V, and a second negative level at −0.9V when the initial logic control signal is at 1.8V.

11. The apparatus according to claim 9, wherein the bootstrap circuit further comprises:
an N-channel metal-oxide-semiconductor field effect transistor (NFET) having a source connected to the second terminal of the capacitive element, a gate configured to receive the initial logic control signal, and a drain connected to the output of the bootstrap circuit; and
a second PFET having a source connected to the output of the inverter gate, a gate configured to receive the initial logic control signal and a drain connected to the output of the bootstrap circuit.

12. The apparatus according to claim 11, wherein the initial logic control signal has a first level of 1.8V and a second level of 0V, and the adapted logic control signal has a first positive level of 1.8V when the initial logic control signal is at 0V, and a second negative level of −0.9V when the initial logic control signal is at 1.8V.

13. The apparatus according to claim 8, wherein the capacitive-feedback transimpedance amplifier comprises an operational amplifier including an inverting input connected to the photodiode and a non-inverting input connected to a cold point, and wherein the auto-zero switch has a first terminal connected to the inverting input of the operational amplifier, and a second terminal connected to the non-inverting input of the operational amplifier.

14. The apparatus according to claim 13, wherein the capacitive-feedback transimpedance amplifier comprises a capacitive element having a first terminal connected to an output of the operational amplifier and a second terminal connected to the inverting input of the operational amplifier.

15. The apparatus according to claim 8, wherein the apparatus is a smartphone or a portable computer.

16. A method comprising:
generating, by a photodiode, an electrical signal according to an ambient light;
receiving, by an input of a capacitive-feedback transimpedance amplifier, the electrical signal generated by the photodiode;
generating, by the capacitive-feedback transimpedance amplifier according to the electrical signal, an amplified signal at an output of the capacitive-feedback transimpedance amplifier;
receiving, by a bootstrap circuit of a control circuit, an initial logic control signal, the initial logic control signal being a positive- or zero-voltage logic control signal; and
generating, by the bootstrap circuit from the initial logic control signal, an adapted logic control signal having a first positive voltage level and a second negative voltage control level for controlling an auto-zero switch connected to the input of the capacitive-feedback transimpedance amplifier.

17. The method according to claim 16, further comprising:
receiving, by an input of an inverter gate of the bootstrap circuit, the initial logic control signal, an output of the inverter gate connected to a first terminal of a capacitive element;
receiving, by a gate of a P-channel metal-oxide-semiconductor field effect transistor (PFET), the initial logic control signal;
receiving, by a source of the PFET, a common-mode voltage; and providing, by an output of the bootstrap circuit, the adapted logic control signal to control the auto-zero switch, the output connected to a second terminal of the capacitive element and to a drain of the PFET.

18. The method according to claim 17, further comprising:
   setting the adapted logic control signal to a first positive level of 0.9V in response to the initial logic control signal being at 0V; and
   setting the adapted logic control signal to a second negative level at −0.9V in response to the initial logic control signal being at 1.8V.

19. The method according to claim 17, wherein the bootstrap circuit further comprises an N-channel metal-oxide-semiconductor field effect transistor (NFET) having a source connected to the second terminal of the capacitive element, a gate configured to receive the initial logic control signal, and a drain connected to the output of the bootstrap circuit, and a second PFET having a source connected to the output of the inverter gate, a gate configured to receive the initial logic control signal and a drain connected to the output of the bootstrap circuit, and wherein the method further comprises:
   setting the adapted logic control signal to a first positive level of 1.8V in response to the initial logic control signal being at 0V; and
   setting the adapted logic control signal to a second negative level of −0.9V in response to the initial logic control signal being at 1.8V.

20. The method according to claim 16, wherein the capacitive-feedback transimpedance amplifier comprises an operational amplifier including an inverting input connected to the photodiode and a non-inverting input connected to a cold point, and wherein the method further comprises:
   closing the auto-zero switch to connect the inverting input of the operational amplifier to the non-inverting input of the operational amplifier; and
   opening the auto-zero switch to disconnect the inverting input of the operational amplifier from the non-inverting input of the operational amplifier.

\* \* \* \* \*